TUNNEL DIODE CIRCUITS

Filed Dec. 19, 1963

INVENTORS
Michio Okamoto
Tsuneo Takezaki
Eiichi Fujino
By Stevens, Davis, Miller + Mosher
ATTORNEYS INVENTORS
Michio Okamoto
Tsuneo Takezaki
Eiichi Fujino
By Stevens, Davis, Miller & Mosher
ATTORNEYS

United States Patent Office 3,364,436
Patented Jan. 16, 1968

3,364,436

TUNNEL DIODE CIRCUITS

Michio Okamoto, Tsuneo Takezaki, and Eiichi Fujino, Kadoma-shi, Osaka, Japan, assignors to Matsushita Electric Industrial Co., Ltd., Osaka, Japan, a corporation of Japan Filed Dec. 19, 1963, Ser. No. 331,727
Claims priority, application Japan, Dec. 22, 1962, 37/58,530; Oct. 30, 1963, 38/57,527
1 Claim. (Cl. 330—61)

ABSTRACT OF THE DISCLOSURE

A tunnel diode circuit having a multi-terminal network between the tunnel diode and a load resistor or load circuit wherein the impedance of the tunnel diode as seen from the multi-terminal network side is infinity and the feedback path for noise generated in the multi-terminal network to the signal input terminal is cut off to improve the noise factor of the circuit.

The present invention relates to electronic circuit means comprising tunnel diodes.

Recently, tunnel diodes have been frequently used in amplifiers, frequency converters and the like, and their excellent performances have been fully verified. In practical application of the tunnel diodes in such electronic circuits, however, various difficulties have so far been encountered which are mainly attributable to the nature of the diodes which are two-terminal elements. An amplifier comprising the diode being a two-terminal element has a bilateral property in its direction of transmission. In this amplifier, a noise generated by a load conductance on the output side is fed back to the input side, and no improvement in the noise factor can be expected at whatever level the gain of the amplifier may be set.

Therefore, the primary object of the invention is to provide an improved tunnel diode circuit which is free from such difficulties encountered by prior arrangements.

According to the invention, there is provided a tunnel diode circuit comprising a tunnel diode, and a multi-terminal network interposed between said tunnel diode and a load or like circuit, wherein resistance of said tunnel diode is selected in accordance with a manner of connection so that a signal frequency impedance when looked from the input side of said multi-terminal network towards the tunnel diode becomes infinitely great.

There are other objects and particularities of the invention which will become obvious from the following description with reference to the accompanying drawings, in which.

Figure 1:
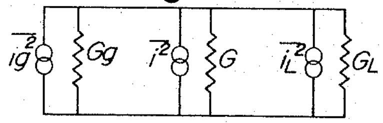
Fig. 1 PRIOR ART
FIG. 1 is an equivalent circuit of noise in a conventional tunnel diode amplifier.

Referring first to FIG. 1, there is shown a circuit diagram of a conventional tunnel diode amplifier in which symbols $G_g$, G and $G_L$ designate a source conductance, a negative conductance of a tunnel diode, and a load conductance, respectively. Symbols $\overline{i_g^2}$, $\overline{i^2}$ and $\overline{i_L^2}$ indicate mean square values of noise currents generated by the respective conductances $G_g$, G and $G_L$, and can be expressed as being connected in parallel with the respective conductances $G_g$, G and $G_L$. It will be understood that, in the amplifier of FIG. 1 comprising the diode being a two-terminal element, any improvement in its noise factor cannot be attained at whatever level the gain of the amplifier may be set due to the inherent property of bilateral transmission of the diode.

As described in the foregoing description, the tunnel diode has not commonly been used to singly form one stage of a multistage amplifier due to its bilateral property. As a remedy therefor, the following methods have been employed heretofore.

Figure 2:
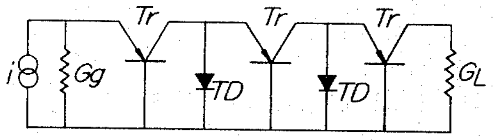
Fig. 2 PRIOR ART
FIG. 2 is a circuit diagram of a conventional tunnel diode multistage amplifier wherein transistors are used as isolators.

(i) A method of combining tunnel diodes with transistors acting as an isolator is disclosed in a paper No. 1411 by Ohhira and others titled "Method of constituting a multistage amplifier with Esaki-diodes—Losasso's circuit" presented in Joint Conference of Four Electrical Societies in Japan in 1961. FIG. 2 shows a circuit diagram of the proposed amplifier. In FIG. 2, symbols *i*, $G_g$ and $G_L$ designate a power source expressed in the form of a current source, an output conductance of the power source, and a load conductance of the multistage amplifier. Three transistors *Tr* form amplifying elements to act as isolators, and two tunnel diodes TD form amplifying elements interposed between stages of the transistors *Tr*. As will be seen from the drawing, the first stage of the amplifier includes no diode and the noise factor of this amplifier is determined solely by the transistor *Tr* in the first stage.

Figure 3:
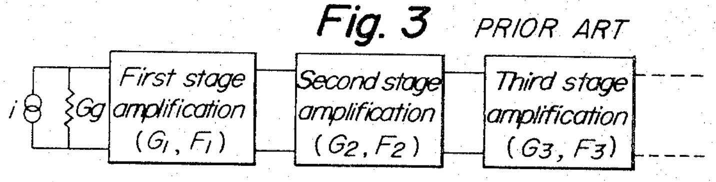
Fig. 3 PRIOR ART
FIG. 3 is a block diagram of a conventional multistage amplifier.

This will become clear from the explanation with reference to FIG. 3. FIG. 3 shows a block diagram of one of such multistage amplifiers, in which symbols *i* and $G_g$ likewise denote a power source expressed in the form of a current source and an output conductance of the power source, respectively. A unilateral amplifier is used in each of first, second, third . . . stages. Symbols ($G_1$, $F_1$), ($G_2$, $F_2$), ($G_3$, $F_3$), . . . denote gains and noise factors in the amplifiers of the first, second, third . . . stages, respectively. In this case, a total noise factor F of the multistage amplifier is given by $$F=F_1+\frac{F_2-1}{G_1}+\frac{F_3-1}{G_1G_2}+\dots \qquad (1)$$

and the value F is almost determined by $F_1$ if $G_1$ is sufficiently great. It will thus be known that the noise factor is determined by the transistor in the first stage and the characteristics of the tunnel diode being a low noise element cannot be utilized in full. In addition to the above, isolators of great size are presently required for use for the VHF band due to a relatively long wavelength of the VHF band, and suitable isolators have not yet been developed. Therefore, there cannot be found any unilateral amplifier comprising the combination of a tunnel diode and an isolator applicable to the VHF band.

(ii) A method of connecting tunnel diodes through circulators has been employed for a frequency range above the UHF band. It is well known that, when a signal is impressed on one terminal of a circulator, an output appears solely at another terminal which is spaced from the former terminal at a definite angle in a predetermined direction. Therefore, the direction of input impressed on the tunnel diode is opposite to the direction of output, and input and output circuits can be separated from each other. Thus it is possible to obtain an excellent gain and noise factor. However, presently available circulators are only useful for a frequency range above the UHF band, and there is a drawback that their size becomes generally greater at a lower frequency.

Figure 4:
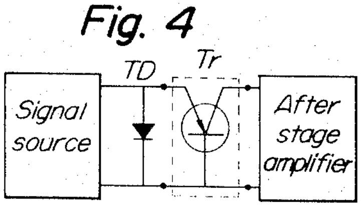
FIG. 4 is a circuit diagram of an amplifier according to the invention comprising a diode and a transistor for the purpose of obtaining a low noise.

FIG. 4 shows a connection diagram in which the invention is applied to the first stage of a multistage amplifier. In FIG. 4, output terminals of a signal source are connected to both terminals of a tunnel diode TD, which is then connected to a four-terminal network comprising a transistor T*r* used as an isolator. Output terminals of the four-terminal network are connected to an amplifier in the succeeding stage. According to this arrangement, an output impedance $R_g$ of the signal source is made to be equal or approximately equal to the absolute value |R| of a negative resistance R of the tunnel diode TD by suitably adjusting a bias voltage on the tunnel diode or, if necessary, by combining a known impedance transoformer therewith.

Figure 5:
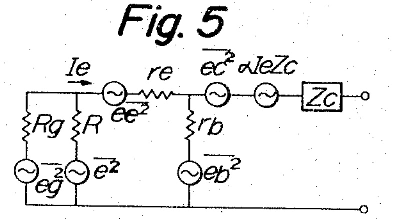
FIG. 5 is a noise equivalent circuit of the first stage amplifier including transistor in the circuit of FIG. 4.

FIG. 5 shows an equivalent circuit of noise generated by the circuit ranging from the signal source to the transistor T*r* in FIG. 4. Symbols $R_g$, R, $r_e$, $r_b$, and $Z_c$ denote an output resistance of the power source, negative resistance of the tunnel diode, emitter resistance of the transistor, base resistance of the transistor, and collector impedance of the transistor, respectively. Symbols $\overline{e_g{}^2}$, $\overline{e^2}$, $\overline{e_e{}^2}$, $\overline{e_b{}^2}$, and $\overline{e_c{}^2}$ denote mean square values of voltage generated in the power source, tunnel diode, transistor emitter, transistor base and transistor collector, respectively. A noise voltage $\alpha I_e Z_c$ generates on the collector side by the transmission characteristics of the transistor.

In FIG. 4, the amplifier comprising the combination of the tunnel diode TD and the transistor T*r* is made to work unilaterally. In order therefore to find out a total noise factor from the Equation 1, it will only be sufficient to find out a noise factor in the first stage. From FIG. 5, it is given by the following equation, $$F=1+\frac{qI_dR_g}{2kT}+\frac{qI_er_e{}^2}{2kTR_g}\left(1+\frac{R_g}{R}\right)^2+\frac{r_b}{R_g}\left(1+\frac{R_g}{R}\right)^2+\frac{qI_e(1-\alpha_o)}{2kTR_g\alpha_o}\left[1+\left(\frac{f}{\sqrt{1-\alpha_o}f_\alpha}\right)^2\right]\left[R_g+(r_e+r_b)\left(1+\frac{R_g}{R}\right)\right]^2 \quad (2)$$

where, $$\overline{e_g}=4kTBR_g$$
$$\overline{e^2}=2qI_dBR^2$$
$$\overline{e_e}=2qI_eBr_e{}^2$$
$$\overline{e_b{}^2}=4kTBr_b$$

$$\overline{e_c{}^2}=\overline{i_c{}^2}/|Z_c|^2=\frac{2q\alpha_oI_e(1-\alpha_o)\left[1+\left(\frac{f}{\sqrt{1-\alpha_o}f_\alpha}\right)^2\right]B/|Z_c|^2}{\left[1+\left(\frac{f}{f\alpha}\right)^2\right]}$$

$I_d$=equivalent noise current of tunnel diode [A]
$I_e$=mean emitter current of transistor [A]
$R_g$=impedance of signal source [Ω]

$R$=negative resistance of tunnel diode [Ω]
$r_e$=emitter resistance of transistor$=\frac{kT}{qI_e}$ [Ω]
$r_b$=base resistance of transistor [Ω]
$Z_c$=collector impedance of transistor [Ω]
$f$=operating frequency [c./s.]
$f\alpha=\alpha$ cut-off frequency [c./s.]
$\alpha_o$=current amplification with grounded base in low frequency [I]
$q$=charge of electron [coulomb]
$k$=Boltzmann's constant
$T$=room temperature [° K]

When it is assumed that $-R=R_g$ in the Equation 2, then in a relation $f<f_\alpha$, the following relation is given.

$$F \doteqdot 1+\frac{qI_dR_g}{2kT} \quad (3)$$

From the above relation, it will be known that the noise factor of this amplifying circuit is determined by the second member of the Equation 2, that is, one of the noises generated by the tunnel diode. When viewed from a different standpoint, the selection of the relation $-R=R_g$ means that the impedance is infinitely great when looked from the input terminals of the four-terminal network towards the tunnel diode TD and the signal source in FIG. 4.

Figure 6:
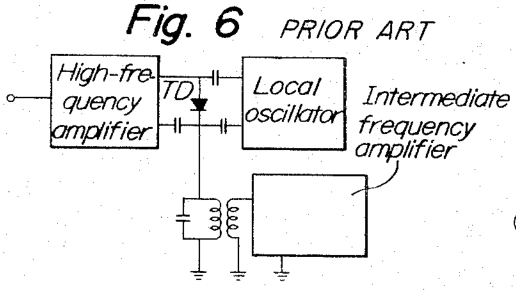
Fig. 6 PRIOR ART
FIG. 6 is a circuit diagram of a conventional frequency converter including a tunnel diode.

The same way of thinking can be applied to a frequency converter comprising a tunnel diode to improve the noise characteristic of the converter. FIG. 6 shows a conventional frequency converter. In the circuit of FIG. 6, output terminals of a high-frequency amplifier being a preceding amplifier or more generally a signal source and output terminals of a local oscillator are connected to the same terminals of a tunnel diode, and an input terminal of an intermediate frequency amplifier is connected to one terminal of the diode to take out a signal at an intermediate frequency. Since, however, the local oscillator output is fed to the same feeding points with those of the signal, distortion is caused in the wave form of the oscillating output due to non-linearity of the conductance of the tunnel diode.

Figure 7:
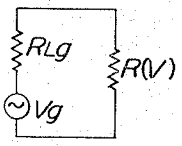
FIG. 7 is a circuit diagram for explaining a waveform of an oscillator output.

The generation of the distortion will be understood from explanation with reference to FIG. 7. In FIG. 7, $R_{Lg}$ is an impedance equivalent to the output impedance of the local oscillator in FIG. 6. Symbol R(V) denotes an internal resistance of the tunnel diode of FIG. 6, and this internal resistance varies with variation in voltage V across the diode. $V_{R(V)}$ impressed on both terminals of the diode is given by an equation, $$V_{R(V)}=\frac{R(V)}{R_{Lg}+R(V)}V_g \quad (4)$$

and, as R(V) varies, $V_{R(V)}$ also varies to provide a cause of distortion. This will further result in instability in the oscillating action. When, on the contrary, an ideal filter is not interposed between the local oscillator and the frequency converter, the output impedance of the oscillator is connected in parallel with the tunnel diode and the frequency conversion efficiency is thereby lowered. (In any of actual circuits, it may be considered that there is no ideal filter incorporated therein.)

Figure 8:
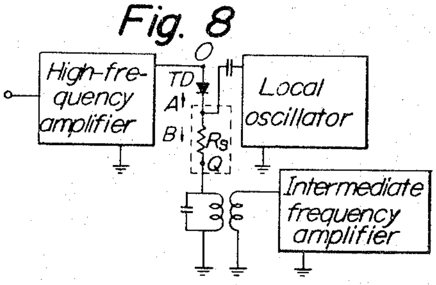
FIG. 8 is a circuit diagram of a frequency converter according to the invention.

FIG. 8 shows a frequency converter according to the invention in which an improved conversion efficiency can be obtained. In the inventive frequency converter, a tunnel diode TD for frequency conversion is connected to point P of a three-terminal network comprising a resistance, a local oscillator is connected to point S, and an intermediate frequency circuit is connected to point Q. In this arrangement, OQ can be regarded as a diode having three terminals O, P and Q. By suitably selecting the value of $R_s$ in a manner that an impedance in the direction B when looked from the point S at the local oscillation frequency will become sufficiently smaller than an impedance in the direction A, the local oscillator is separated from the amplifying system comprising a high-frequency amplifier→a frequency mixer→an intermediate frequency amplifier.

Explanation will now be made with regard to the frequency conversion action with reference to FIGS. 6 and 8. Assume that the V–I characteristic of the tunnel diode is given by the relation $$I=f(V) \quad (5)$$

Then, when, in FIG. 6, the signal and the local oscillator output are impressed on both terminals of the diode, $$I=f(V_S \sin \omega_S t+V_L \sin \omega_L t) \quad (6)$$

where, $V_S \sin \omega_S t$: signal voltage
$V_L \sin \omega_L t$: local oscillator output voltage and an intermediate frequency component is derived therefrom. With regard to FIG. 8, it is considered that the operating point varies with relation to $V_L \sin \omega_L t$, and, in this case, the Equation 5 is expressed as $$I=f(V+V_L \sin \omega_L t)$$

When the signal is added, this equation is expressed as $$I=f(V_S \sin \omega_S t+V_L \sin \omega_L t)$$

and this is identical with the Equation 6. Therefore, the frequency conversion action is the same for both of the converters of FIGS. 6 and 8.

Figure 9:
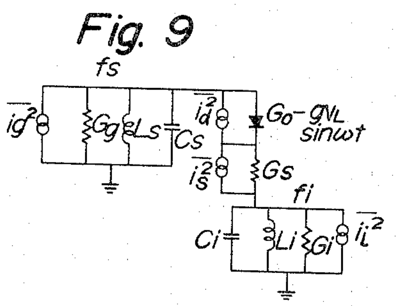
FIG. 9 is an equivalent circuit of noise in the inventive circuit of FIG. 8.

FIG. 9 shows an equivalent circuit of noise in the inventive frequency conversion circuit shown in FIG. 8. In FIG. 9, $G_g$, $G_o=gV_L \sin \omega_L t$, $G_S$, and $G_i$ indicate an output conductance of the power source, an instantaneous value of a conductance of the tunnel diode, a load conductance of the local oscillator, and a load conductance of the frequency converter, respectively. The load conductance $G_i$ of the frequency converter, at the same time, forms an input conductance of the intermediate frequency amplifier. In order to effect parallel resonance at an input frequency $f_S$ and an output frequency $f_i$ in the frequency converter, inductances and capacitances ($L_S$, $C_S$) and ($L_i$, $C_i$) are disposed on the respective sides of the converter. Symbols $\overline{i_g^2}$, $\overline{i_d^2}$, $\overline{i_s^2}$, and $\overline{i_i^2}$ indicate mean square values of noise currents generated by the power source, diode, load of the local oscillator, and load of the frequency converter, respectively. From FIG. 9, the noise factor F can be obtained from an equation, $$F=1+\frac{G_s\left(\frac{G_o}{G_o+G_s}\right)^2+G_e\left(\frac{G_s}{G_o+G_s}\right)^2}{G_g}+\frac{\left\{G_i+G_s\left(\frac{G_o}{G_o+G_s}\right)^2+G_e\left(\frac{G_s}{G_o+G_s}\right)^2\right\}\left\{G_g+\frac{G_oG_s}{G_o+G_s}\right\}}{G_g\left(G_i+\frac{G_oG_s}{G_o+G_s}\right)}\times\frac{\left(G_g+\frac{G_oG_s}{G_o+G_s}\right)\left(G_i+\frac{G_oG_s}{G_o+G_s}\right)}{g^2V_L^2} \quad (7)$$

where $\overline{i_g^2}=4kTBG_g[A^2]$
$\overline{i_d^2}=2qI_dB[A^2]$
$\overline{i_s^2}=4kTBG_s[A^2]$
$\overline{i_i^2}=4kTBG_i[A^2]$
$f_s$: frequency of signal [c./s.]
$f_i$: frequency of intermediate frequency signal [c./s.]
$G_g$: conductance of signal source [℧]
$G_o$: mean conductance of tunnel diode [℧]
$G_s$: load conductance of local oscillator [℧]
$G_i$: load conductance of frequency converter [℧]
$G_e$: $qI_d/2kT$ [℧]
$I_d$: equivalent noise current in tunnel diode [A]
$T$: room temperature: 290° K.

Assume that $G_o=0$ in the Equation 7, then $$F=1+\frac{G_e}{G_g}+\frac{(G_i+G_e)G_g}{G_gG_i}\times\frac{G_gG_i}{g^2V_L^2}=1+\frac{G_e}{G_g}+\frac{(G_i+G_e)G_g}{g^2V_L^2} \quad (8)$$

It will be seen that Equation 8 indicates that the noise factor is determined independently of $G_s$. By $G_o=0$, it is meant that the operating point is selected to be set at a point where a maximum or minimum current is given, and this means that the impedance when looked from point P or the input terminal of the three-terminal network towards the input side is made open. This is a most advantageous utilization of the conversion efficiency with respect to the local oscillator output.

Figure 10:
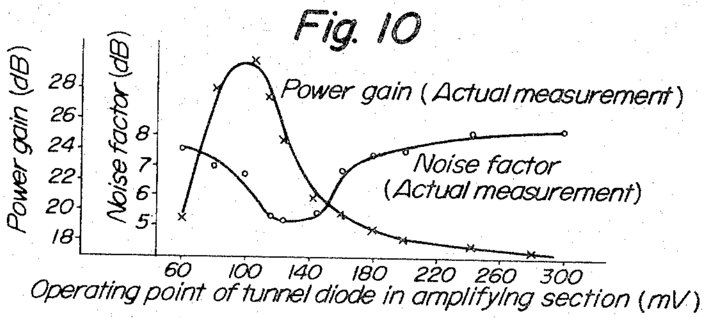
FIG. 10 is a chart showing characteristic curves of gain and noise in the amplifier of FIG. 4 with relation to variation in an operating point of the tunnel diode.
Figure 11:
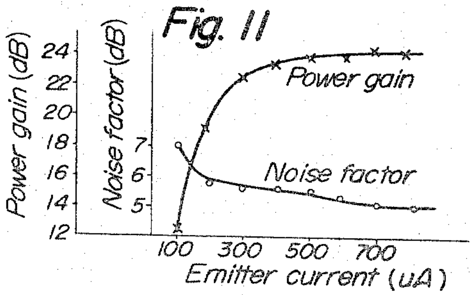
FIG. 11 is a chart showing characteristic curves of gain and noise in the amplifier of FIG. 4 with relation to variation in a mean emitter current of the transistor.

From the foregoing description, it will be understood that, in the tunnel diode circuit (amplifier) of the invention, its noise factor is determined solely by the noise inherent in the tunnel diode and the circuit can be made unilateral. The gain obtained is the product of the gain of the tunnel diode and the gain of the multi-terminal network including the transistor, and is quite stable. Since the tunnel diode circuit of the invention does not require the use of such element as an isolator, it can be made small in size and equally satisfactory performance can be obtained for any of the UHF band, VHF band and a lower frequency band than those. FIGS. 10 and 11 show test results obtained on an amplifier including the tunnel diode circuit of the invention.

FIG. 10 shows the power gain and noise factor of this amplifier with relation to the operating point of the tunnel diode wherein the operating point is made to vary from 60 mv. to 300 mv. From FIG. 10, it will be seen that the noise factor of the amplifier takes a value of 5.2 db at a point satisfying said relation $-R=R_g$, that is, at the operating point of the order of 120 mv., and this value is close to the noise factor of 4.8 db which is theoretically determined solely by the tunnel diode. FIG. 11 shows the power gain and noise factor of this amplifier with relation to variation in the mean emitter current of a transistor combined with the tunnel diode. From FIG. 11, it will be seen that, within a range of approximately constant gain, the noise factor does not show any increase in spite of increase in the mean emitter current. This shows that the total noise factor of this emitter is not affected by the noise of the transistor.

Figure 12:
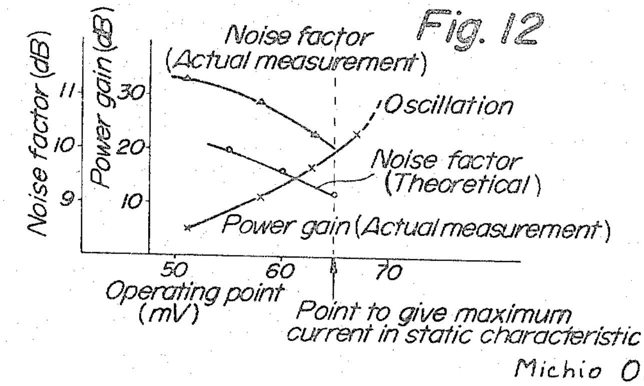
FIG. 12 is a chart showing characteristic curves of gain and noise in the frequency converter of FIG. 8 with relation to variation in an operating point of the tunnel diode.

With regard to the tunnel diode circuit adapted to be incorporated in a frequency converter, it will be understood from the foregoing description that the invention provides a frequency converter which is extremely stable compared with conventional frequency converters, and makes possible to eliminate any degradation in the total noise factor of such frequency converter due to a noise generated by a load circuit of a local oscillator incorporated in the converter. FIG. 12 shows the power gain and noise factor of the frequency converter with the tunnel diode circuit of the invention with relation to variation in the operating point of the tunnel diode for frequency conversion.

What is claimed is:

1. A tunnel diode frequency converting circuit comprising, a high frequency amplifier signal source, an external oscillator, an intermediate frequency amplifier output circuit, a tunnel diode for frequency conversion, and a resistor, one terminal of said tunnel diode connected to an output terminal of said high frequency signal source, the other terminal of said tunnel diode connected to said intermediate frequency amplifier circuit through said resistor, said external oscillator connected to the junction point of said tunnel diode and said resistor, the operating point of said tunnel diode being set where $dI/dV=0$ and the impedance as seen from said junction point toward said intermediate frequency amplifier circuit side being set lower than the impedance as seen from said junction point toward said tunnel diode side.

References Cited

UNITED STATES PATENTS

| | | | |
|---|---|---|---|
| 3,040,267 | 6/1962 | Seidel. | |
| 3,103,600 | 9/1963 | Lewin | 330—61 X |
| 3,110,862 | 11/1963 | Chasek | 325—449 X |
| 3,116,459 | 12/1963 | Tieman | 330—61 X |
| 3,235,806 | 2/1966 | Hirsch | 325—449 |
| 3,260,953 | 7/1966 | Kaufman et al. | 330—61 |

ROY LAKE, *Primary Examiner.*

NATHAN KAUFMAN, *Examiner.*